United States Patent
Stansbury

[11] Patent Number: 6,001,724
[45] Date of Patent: Dec. 14, 1999

[54] METHOD FOR FORMING BUMPS ON A SEMICONDUCTOR DIE USING APPLIED VOLTAGE PULSES TO AN ALUMINUM WIRE

[75] Inventor: Darryl M. Stansbury, Boise, Id.

[73] Assignee: Micron Technology, Inc., Boise, Id.

[21] Appl. No.: 08/976,927

[22] Filed: Nov. 24, 1997

Related U.S. Application Data

[63] Continuation of application No. 08/593,025, Jan. 29, 1996, abandoned.

[51] Int. Cl.$^6$ ................................................. H01L 21/44
[52] U.S. Cl. ...................... 438/617; 257/784; 228/180.5; 228/4.5
[58] Field of Search .................................... 438/613, 612, 438/617, 469, 119; 29/592.1; 228/180.5, 4.5, 1.1; 257/784, 737

[56] References Cited

U.S. PATENT DOCUMENTS

| | | | |
|---|---|---|---|
| 3,380,155 | 4/1968 | Burks | 437/183 |
| 3,654,694 | 4/1972 | Dunlap | 29/587 |
| 4,098,447 | 7/1978 | Edson et al. | 228/4.5 |
| 4,323,759 | 4/1982 | Edson et al. | 219/137 |
| 4,388,512 | 6/1983 | Salzer et al. | 219/56.22 |
| 4,390,771 | 6/1983 | Kurtz et al. | 219/56.22 |
| 4,476,366 | 10/1984 | Kurtz et al. | 219/56.22 |
| 4,594,493 | 6/1986 | Harrah et al. | 219/56.22 |
| 4,661,192 | 4/1987 | McShane | 156/292 |
| 4,889,275 | 12/1989 | Ramsey | 228/180.5 |
| 5,014,111 | 5/1991 | Tsuda et al. | 437/183 |
| 5,249,450 | 10/1993 | Wood et al. | 72/359 |
| 5,249,732 | 10/1993 | Thomas | 437/183 |
| 5,302,550 | 4/1994 | Hirota et al. | 438/194 |
| 5,386,624 | 2/1995 | George et al. | 29/832 |
| 5,395,037 | 3/1995 | Takahashi et al. | 228/180.5 |
| 5,457,356 | 10/1995 | Parodos | 313/505 |
| 5,578,527 | 11/1996 | Chang et al. | 438/119 |
| 5,612,256 | 3/1997 | Stansbury | 438/20 |

FOREIGN PATENT DOCUMENTS

0133118 A2  2/1985  European Pat. Off. ........ H01L 21/48

OTHER PUBLICATIONS

Miyake, Hiroshi et al., "A Ball Forming Process for the Aluminum Ball Bonding of Semiconductor Devices", Denki Kagaku, No. 10, 1985, Japan, pp. 824–827.

*Primary Examiner*—Wael Fahmy
*Assistant Examiner*—Kurt Eaton
*Attorney, Agent, or Firm*—Stephen A. Gratton

[57] ABSTRACT

A method of forming ball bumps on a pad of a semiconductor die using aluminum wire is provided. The method includes providing an aluminum wire and a thermosonic ball bonding apparatus. The aluminum wire is held in a capillary tool of the ball bonding apparatus and a molten ball is formed on the wire using an electronic flame off (EFO). A forming gas comprising hydrogen and an inert gas, prevents the molten ball from oxidation hardening during formation thereof. Following formation, the molten ball is shaped into a ball bump by the capillary tool and then pressed against the pad while the capillary tool is vibrated. The completed die can be bonded to a substrate pad on a supporting substrate by using a bonding technique such as flip chip bonding, chip on glass bonding, chip on flex bonding, TAB bonding, and z-axis adhesive bonding.

20 Claims, 1 Drawing Sheet

METHOD FOR FORMING BUMPS ON A SEMICONDUCTOR DIE USING APPLIED VOLTAGE PULSES TO AN ALUMINUM WIRE

CROSS REFERENCE TO RELATED APPLICATIONS

This application is a continuation of application Ser. No. 08/593,025 filed Jan. 29, 1996, now abandoned.

FIELD OF THE INVENTION

This invention relates to semiconductor manufacture and more particularly to an improved method for forming bumps on a semiconductor die using aluminum bonding wire.

BACKGROUND OF THE INVENTION

One type of semiconductor die having a raised topology is known in the art as a "bumped" die. A bumped die includes bond pads formed with a bump of solderable or bondable material. Bumped dice are used for flip chip bonding and for tape automated bonding (TAB). With these bonding systems, the die is mounted face down to a supporting substrate, such as tape or a printed circuit board, and then bonded to a corresponding connection point, such as a substrate pad.

The bumps not only secure the die to the substrate membrane but also establish electrical communication between the bond pads on the die and the corresponding connection points on the substrate. For flip chip bonding, the bond between the bump and a substrate pad can be formed by reflow soldering. For TAB bonding, the bond between the bump and conductors formed on flexible tape can be formed using thermocompression bonding. Bumps are also used for "chip on glass" and "chip on flex" systems that utilize a z-axis conductive material and a variety of substrate materials.

Typically, the bumps are formed as balls of material with a flat tip and a diameter of from 50 μm to 100 μm. The bumps can be formed using plating or evaporation of metals through holes in a metal mask. For example, it is common practice to form the bumps out of a solderable material such as gold or a tin/lead alloy. Gold or tin/lead bumps can be formed on a bond pad of a die using a plating, evaporation, sputtering, or ball bonding process. These plating processes for gold can also include forming a barrier layer out of a material such as titanium/tungsten. Evaporation and sputtering processes can also be used to form solderable lead/tin bumps for a bonding process developed by IBM and known as C4.

One disadvantage of metal mask fabrication processes for bumps is that capital expenditure for process equipment is high. The high capital expenditure can be justified if the bumps are being used on a high volume product. However, for some products, such as field emission displays, the capital costs associated with forming custom bumped semiconductor dice can be prohibitive.

Another disadvantage of bumps formed of gold is that the bond pads on a die are typically formed of aluminum. Because the bond pads and bumps are formed of dissimilar materials, galvanic reactions, poor adhesion, thermal mismatch and brittle intermetallic compounds can result. One widely known reliability problem occurs at the gold-aluminum interface wherein intermetallic compounds such as $AuAl_2$ (purple plague) are formed. Another problem, known as "Kirkendahl voiding", can occur at elevated temperatures, wherein aluminum diffuses rapidly into the $AuAl_2$ phase and leaves voids at the interface.

These problems can occur not only during the bump-substrate bonding process but also during subsequent heat cycling of electronic products that utilize bumped semiconductor dice. For example, field emission displays are constructed using heat cycles that can approach 400° C. These high temperatures can cause the formation of intermetallics between the gold bumps and aluminum pads, resulting in purple plaque and Kirdendahl voiding.

Because pads on semiconductor dice are typically formed of aluminum, it would be desirable to be able to also form the bumps for bond pads out of aluminum. This would simplify the bump structure and would increase the reliability of the interconnection between the bump and pad. However, the properties of aluminum make aluminum bump formation difficult.

In view of the foregoing, it is an object of the present invention to provide an improved method for forming bumps on the pads of semiconductor dice using aluminum wire. It is a further object of the present invention to provide an improved method for forming bumps on semiconductor dice using aluminum wire and conventional modified ball bonding apparatus. It is a still further object of the present invention to provide an improved method for forming field emission displays, and other electronic devices, with semiconductor dice having ball bumps formed using aluminum wire.

Other objects, advantages and capabilities of the present invention will become more apparent as the description proceeds.

SUMMARY OF THE INVENTION

In accordance with the present invention, an improved method for forming a bump on a pad of a semiconductor die using aluminum wire is provided. The method, simply stated, comprises: providing a semiconductor die having a pad; providing an aluminum wire; forming a ball bump on the aluminum wire using a thermosonic ball bonding apparatus in a forming gas comprising hydrogen and an inert gas; and then thermosonically bonding the ball bump to the pad of the die.

During a ball forming sequence, the aluminum wire is held within a capillary tool of the ball bonding apparatus and a molten ball is formed on an end of the wire. A preferred method of forming the molten ball is by electronic flame off (EFO) with a pulsed voltage. During formation of the molten ball, the hydrogen-inert gas composition of the forming gas prevents oxidation hardening of the aluminum. After the molten ball is formed, it is shaped into a ball bump by the capillary tool, and then thermosonically bonded to the pad on the die. The attached ball bump is then severed from the remainder of the wire. During shaping of the ball bump, a relatively weak neck portion forms at the point of connection with the wire that allows the wire to be easily severed from the ball bump.

Following the formation process, the aluminum ball bump can be bonded to a corresponding connection point on a supporting substrate, or to conductors on a flexible tape, using a variety of bonding techniques. These bonding techniques can include: flip chip bonding, chip on glass bonding, chip on flex bonding, TAB bonding, and z-axis adhesive bonding. In an illustrative embodiment a field emission display package is assembled using a bumped die formed in accordance with the invention.

DETAILED DESCRIPTION OF THE PREFERRED EMBODIMENTS

Referring to FIGS. 1A–1D, a method for forming bumps on a semiconductor die using aluminum wire is shown. The method is performed using a conventional modified thermosonic ball bonder apparatus having a capillary tool and an electronic flame off (EFO). Suitable ball bonder apparatus are manufactured by Kulicke and Soffa, Industries Inc., Horsham, Pa. and others. Suitable models from Kulicke and Soffa are designated model nos. 1414, 1482 and 1484. These ball bonder apparatus are designed for forming gold ball wire bonds but can be modified for use with the method of the invention.

Figure 1A:
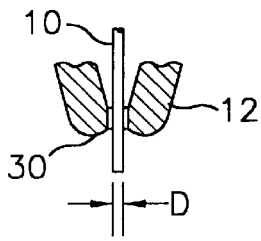
FIGS. 1A–1D are schematic cross sectional views illustrating formation of a ball bump on a pad of semiconductor die using an aluminum wire in accordance with the invention.

Initially, as shown in FIG. 1A, an aluminum wire 10 is retained within a capillary tool 12 of the ball bonder apparatus. The aluminum wire 10 has a diameter D. A range for the diameter D can be from about 12 μm to 1000 μm with about 25 μm being representative. Preferably the aluminum wire is formed of an aluminum alloy such as aluminum-silicon or aluminum-magnesium.

Figure 1B:
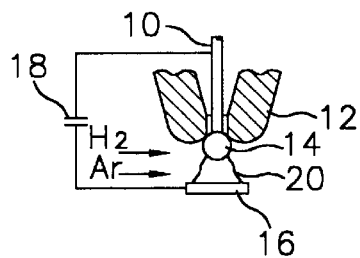

Next, as shown in FIG. 1B, a molten ball 14 is formed on the end of the aluminum wire 10 using an electronic flame off (EFO). During the electronic flame off, the wire 10 and a negative electrode 16 are electrically coupled to a voltage source 18. The negative electrode is preferably formed of tungsten. A voltage of from about 15,000 volts to 30,000 volts is applied in pulses such that a spark discharge 20 crosses the gap between the wire 10 and electrode 16 and heats the wire to form the ball 14. The gap between the electrode 16 and the end of the wire 10 during the electronic flame off is about 0.005 inches. The pulsing type EFO electronics are critical to formation of aluminum balls. This step forms the ball 14 with a diameter that is about 1.5 to 3 times the diameter D of the wire 10.

During the ball forming step (FIG. 1B), a forming gas comprising an inert gas, such as argon (Ar) or helium (He), and hydrogen (H₂) is used to prevent oxidation hardening of the aluminum ball. The percentage hydrogen to the inert gas by volume can be from about 1 to 25% at room temperature, with a preferred range of about 5–10% (i.e., vol % hydrogen-vol % inert gas). The forming gas can be blown using a diffuser technique and a "bath" of forming gas. The enclosure and pressurization of the gas is not necessary. However, oxygen in the forming gas should be kept below about 100 PPM and this can be done without the use of a "glove box" type environment.

Figure 1C:
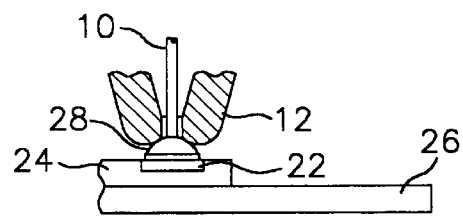

Next, as shown in FIG. 1C, the capillary tool 12 shapes the molten ball 14 into a ball bump 28 and then bonds the ball bump 28 to an aluminum bond pad 22 formed on a semiconductor die 24. The capillary tool 12 can be formed with a flared opening 30 (FIG. 1A) to facilitate shaping of the ball bump 28. By way of example, the angle of the sidewalls of the flared opening 30 with respect to the longitudinal axis of the capillary tool 12 can be about 45°. For shaping the ball bump 28, the molten ball 14 (FIG. 1B) can be pulled into the opening 30 by pulling the wire 10 or the capillary tool 12 can simply press the molten ball 14 against the bond pad 22.

Still referring to FIG. 1C, following shaping of the ball bump 28, the ball bump 28 is bonded to the bond pad 22. During the bonding step, the die 24 is supported by a heated substrate 26. In addition, during the bonding step the capillary tool 12 applies a vertical load on the ball 14 and bond pad 22 while ultrasonically exciting the wire 10. A vibrational frequency for the capillary tool 12 can be between about 30 kHz to 120 kHz with a representative frequency about 60 kHz. A vertical load applied by the capillary tool 12 can be between about 50 grams to 300 grams with a representative load about 130 grams. During the bonding step, the die 24 and substrate 26 can be heated to a temperature of between about 80° C. to 150° C.

Figure 1D:
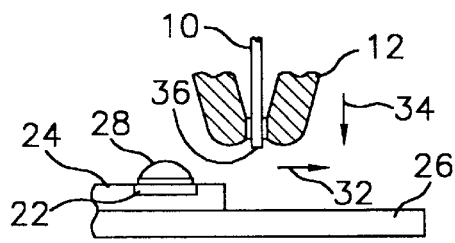

Following bonding of the ball bump 28 to the bond pad 22, and as shown in FIG. 1D, the wire 10 is severed from the ball bump 28. Severing of the ball bump 28 can be accomplished by moving the capillary tube 12 laterally and downwardly with respect to the ball bump 28 as indicated by the directional arrows 32 and 34. Alternately the capillary tool 12 can be constructed to exert a pinching motion on the wire 10. The severing process is facilitated because a relatively weak neck portion 36 forms between the wire 10 and the ball bump 28. This weak neck portion 36 has been an impediment in the art to thermosonic wire bonding using aluminum wire but is an advantage for forming a ball bump.

Figure 2:
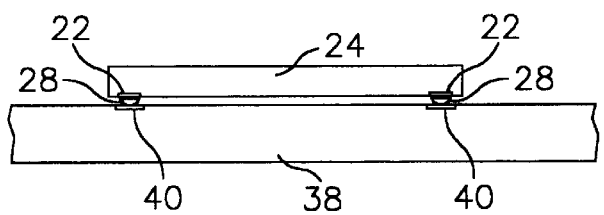
FIG. 2 is a cross sectional view illustrating a die formed with aluminum ball bumps in accordance with the invention and bonded to connection points on a supporting subtrate.

Referring to FIG. 2, the bumped die 24 is shown mounted to a supporting substrate 38, such as a printed circuit board. The supporting substrate 38 includes a pattern of substrate pads 40 corresponding to the pattern of the ball bumps 28 on the die 24. Following an alignment procedure, the ball bumps 28 are bonded to the substrate pads 40. Bonding can be by one of several methods. For example, thermocompression bonding can be accomplished using heat and pressure applied by a heated thermode. Gang bonding of multiple ball bumps 28 can also be employed using a single elongated thermode. Alternately in place of thermocompression bonding, a z-axis adhesive such as a z-axis epoxy can be used. In addition, the aluminum ball bumps 28 can be bonded to a TAB tape (not shown) using an ultrasonic technique such as single point tab.

Figure 3:
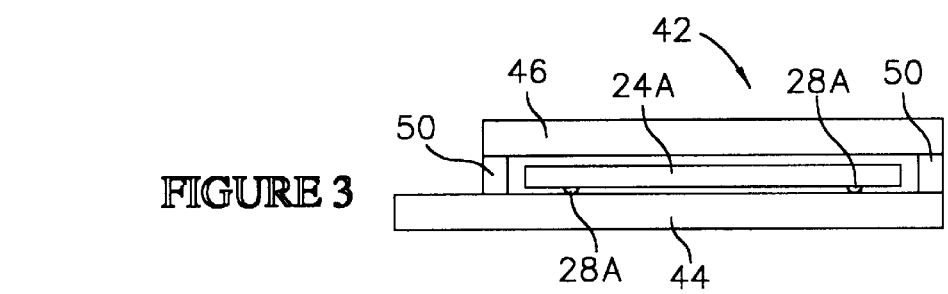
FIG. 3 is a schematic cross sectional view of a field mission display constructed with a semiconductor die having ball bumps formed in accordance with the invention using aluminum wire.

Referring to FIG. 3, the method of the invention is illustrated in the formation of a field emission display package 42. The field emission display package 42 includes a face plate 44 and a back plate 46. Both the face plate 44 and the back plate 46 can be formed of a transparent material such as glass using techniques that are known in the art. A display screen (not shown) is formed on an inside surface of the face plate 44 and is viewable through the face plate 44. For example, the display screen can include phosphors in electrical contact with a transparent conductive layer formed of material such as indium oxide, tin oxide or indium tin oxide.

In addition, a semiconductor die 24A having aluminum ball bumps 28A formed as previously described, is mounted to the face plate 44 (or to spacers attached to the face plate 44) in an evacuated sealed space 48 formed during formation of the package 42. The bond pads 28A can be bonded as previously described to conductors, pads or tape formed on the face plate 44. For some applications, the die 24A can be formed with field emitter sites (not shown) and an associated grid structure (not shown) to function as a base plate for the field emission display. The emitter sites and grid for the die 24A formed as a base plate can be operated to form a visual image on the display screen.

U.S. Pat. No. 5,302,238 to Roe et al.; U.S. Pat. No. 5,229,331 to Doan et al.; and U.S. Pat. No. 5,186,670 to Doan et al., all of which are incorporated herein by reference, disclose methods for fabricating various elements of a field emission display package 42.

During assembly of the package 42, a peripheral seal 50 is formed between the face plate 44 and the back plate 46. At the same time that the peripheral seal 50 is being formed, the sealed space 48 can be evacuated to a pressure of $1\times10^{-6}$ Torr or less. One method for forming the peripheral seal 50 and evacuating the sealed space 48 is disclosed in U.S. Pat. No. 5,697,825 which is incorporated herein by reference.

While the invention has been described with reference to certain preferred embodiments, as will be apparent to those skilled in the art, certain changes and modifications can be made without departing from the scope of the invention as defined by the following claims.

I claim:

1. A method for forming a bump on a pad of a semiconductor die, comprising:

providing a wire comprising aluminum;

providing a ball bonding apparatus comprising a negative electrode, and a capillary tool with an opening for holding the wire having a flared sidewall on a terminal end thereof;

forming a molten ball on the wire using electronic flame off performed using the apparatus by applying a plurality of voltage pulses of about 15,000 and 30,000 volts to the wire and to the negative electrode, in a forming gas comprising hydrogen gas and an inert gas to prevent oxidation hardening of the molten ball;

shaping the molten ball into a ball bump with a neck portion attached to the wire by pressing the molten ball against the sidewall;

following the shaping step, attaching the ball bump to the pad by vibrating and pressing the ball bump against the pad using the capillary tool;

heating the ball bump during the attaching step to a temperature of about 80° C. to 150° C.; and following the attaching step, severing the wire from the ball bump at the neck portion thereof by manipulating the capillary tool.

2. The method of claim 1 wherein the wire comprises an alloy selected from the group consisting of aluminum-silicon alloy and aluminum-magnesium alloy.

3. The method of claim 1 wherein the sidewall is flared at an angle of about 45° with respect to a longitudinal axis of the tool.

4. The method of claim 1 further comprising flip chip bonding the die to a supporting substrate.

5. The method of claim 4 wherein the supporting substrate comprises a field emission display.

6. The method of claim 1 wherein a percentage by volume of the hydrogen gas to the inert gas at room temperature is about 1 to 25%.

7. A method for forming a bump on a pad of a semiconductor die, comprising:

providing a wire comprising aluminum;

providing a ball bonding apparatus comprising a negative electrode and a capillary tool for holding the wire having an opening with a flared sidewall on a terminal end thereof;

forming a molten ball on the aluminum wire by electronic flame off performed using the apparatus by applying a plurality of voltage pulses of about 15,000 volts to 30,000 volts to the wire and to the negative electrode, in a forming gas comprising hydrogen gas and an inert gas to prevent oxidation hardening of the molten ball;

shaping the molten ball by pressing the molten ball against the sidewall to form a ball bump attached at a neck portion to the wire;

heating the ball bump to a temperature of between about 80° C. to 150° C.;

vibrating the capillary tool and pressing the ball bump against the pad; and following the vibrating step, severing the ball bump at the neck portion by moving the capillary tool with respect to the ball bump.

8. The method of claim 7 wherein the wire comprises an alloy selected from the group consisting of aluminum-silicon and aluminum-magnesium.

9. The method of claim 8 wherein the severing step comprises moving the capillary tool laterally and downwardly with respect to the ball bump.

10. The method of claim 9 wherein the sidewall is flared at an angle of about 45°.

11. The method of claim 10 wherein the capillary tool presses the ball bump against the pad with a pressure of between about 50 grams to 300 grams.

12. The method of claim 11 further comprising bonding the ball bump to a supporting substrate using a chip on glass bonding process.

13. A method for forming a field emission display comprising:

providing a wire comprising aluminum;

providing a semiconductor die comprising a pad;

providing a ball bonding apparatus comprising a negative electrode and a capillary tool for holding the wire having a flared sidewall on a terminal end thereof;

forming a molten ball on the wire using electronic flame off performed using the apparatus by applying a plurality of voltage pulses to the wire and to the negative electrode, in a forming gas comprising hydrogen and an inert gas to prevent oxidation hardening of the molten ball;

shaping the molten ball into a ball bump by manipulation of the capillary tool or the wire and contact of the molten ball with the sidewall, the ball bump including a neck portion attached to the wire;

attaching the ball bump to the pad by vibrating and pressing the ball bump against the pad using the capillary tool;

heating the ball bump to a temperature of about 80° C. to 150° C. during the attaching step;

following the attaching step, severing the wire from the ball bump at the neck portion by manipulating the capillary tool; and bonding the ball bump to a second pad on the field emission display.

14. The method of claim 13 wherein the second pad comprises a faceplate of the field emission display package.

15. The method of claim 13 wherein bonding the ball bump to the second pad comprises flip chip bonding.

16. The method of claim 13 wherein bonding the ball bump to the second pad comprises chip on glass bonding.

17. The method of claim 13 wherein a percentage by volume of the hydrogen gas to the inert gas at room temperature is about 1 to 25%.

18. The method of claim 13 wherein bonding the ball bump to the second pad comprises chip on flex bonding.

19. The method of claim 13 wherein the wire comprises an aluminum alloy selected from the group consisting of aluminum-silicon and aluminum-magnesium.

20. The method of claim 13 wherein the die comprises field emitter sites aligned with the faceplate.

* * * * *

UNITED STATES PATENT AND TRADEMARK OFFICE
CERTIFICATE OF CORRECTION

PATENT NO. : 6,001,724
DATED : Dec. 14, 1999
INVENTOR(S) : DARRYL M. STANSBURY

It is certified that error appears in the above-identified patent and that said Letters Patent is hereby corrected as shown below:

In claim 1, column 5, line 24, change "and" to --to--.

Signed and Sealed this

Twenty-fifth Day of July, 2000

Attest:

Q. TODD DICKINSON

Attesting Officer

Director of Patents and Trademarks